(12) United States Patent
Ho

(10) Patent No.: US 12,687,587 B2
(45) Date of Patent: Jul. 21, 2026

(54) BATTERY CONTROLLER WITH MULTI-LEVEL REDUNDANCY

(71) Applicant: Lithium Power Inc., San Jose, CA (US)

(72) Inventor: Minghung Ho, San Jose, CA (US)

(73) Assignee: Lithium Power Inc., San Jose, CA (US)

( * ) Notice: Subject to any disclaimer, the term of this patent is extended or adjusted under 35 U.S.C. 154(b) by 479 days.

(21) Appl. No.: 18/336,453

(22) Filed: Jun. 16, 2023

(65) Prior Publication Data

US 2024/0418790 A1 Dec. 19, 2024

(51) Int. Cl.
G01R 31/392 (2019.01)
G01R 31/367 (2019.01)
G01R 31/396 (2019.01)

(52) U.S. Cl.
CPC ......... G01R 31/392 (2019.01); G01R 31/367 (2019.01); G01R 31/396 (2019.01)

(58) Field of Classification Search
CPC .. G01R 31/392; G01R 31/367; G01R 31/396; B60L 3/0046; H01M 10/4207; H01M 10/425; H01M 10/482; H01M 10/42;
H02J 7/0013; H02J 7/00032; H02J 7/0047; H02J 7/0029; H02J 7/00308; H02J 7/0048; H02J 7/005
See application file for complete search history.

(56) References Cited

U.S. PATENT DOCUMENTS

| | | | |
|---|---|---|---|
| 2009/0206841 A1* | 8/2009 | Weng ................... | G01R 31/396 307/64 |
| 2020/0319252 A1* | 10/2020 | Katrak ............... | G01R 31/3648 |
| 2020/0381930 A1* | 12/2020 | Kano .................. | H02J 7/00036 |
| 2023/0193869 A1* | 6/2023 | Wu ..................... | F02N 11/0807 701/107 |

FOREIGN PATENT DOCUMENTS

| | | | | |
|---|---|---|---|---|
| CN | 106302064 B | * | 3/2019 | ....... H04L 12/40189 |
| CN | 114784902 A | * | 7/2022 | ............ H02J 7/0013 |

* cited by examiner

*Primary Examiner* — Lal Ce Mang
(74) *Attorney, Agent, or Firm* — Wang Law Firm, Inc.

(57) ABSTRACT

A battery management system and method for enabling a battery system to overcome single point failure in its control system and to deliver electrical charges steadily through redundancy implementation. The battery management system has redundant hardware devices, including multiple microcontrollers (MCU) connected to multiple controller area (CAN) network buses. An active MCU periodically checks health information from a standby MCU.

13 Claims, 3 Drawing Sheets

BATTERY CONTROLLER WITH MULTI-LEVEL REDUNDANCY

FIELD OF THE INVENTION

The present invention relates to battery and more specifically to battery controller.

BACKGROUND OF THE INVENTION

Battery usage is becoming increasingly common and popular in all applications. As the battery usage spreads through all different parts of daily life, the interruption of delivery of electricity from such batteries start to become a problem in the life of those people who depend on these batteries.

This invention provides a solution to alleviate the impact of sudden unavailability of the batteries.

SUMMARY OF THE INVENTION

In one embodiment, the invention is a fault tolerant battery management system with a plurality of battery cells. The fault tolerant battery management system comprises a plurality of application front end (AFE) devices, a plurality of gauges connected to the AFE devices, and a plurality of micro control units (MCUs) connected to the gauges. Each AFE device is connected to a plurality of battery cells, a first AFE device in the plurality of AFE devices being in active mode and a second AFE device in the plurality of AFE devices being in standby mode. Each gauge is connected to both the first AFE device and the second AFE device, a first gauge in the plurality of gauges being in active more and a second gauge in the plurality of gauges being in standby mode. Each MCU is connected to both the first gauge and the second gauge, a first MCU of the plurality of MCUs being in active mode and a second MCU of the plurality of MCUs being in standby mode. Both MCUs are connected to a communication bus and each MCU is assigned an identification (ID) number, wherein when the fault tolerant battery management system boots up, each MCU goes through a self-check and a healthy MCU with the lowest ID number is assigned as in active mode.

In another embodiment, the invention is a fault tolerant battery management system further comprises a plurality of controller area network (CAN) buses to which the plurality of MCUs are connected.

In yet another embodiment, the invention is a fault tolerant battery management system with an active MCU periodically broadcasts a message onto a CAN bus to indicate the active MCU is healthy.

The present system and methods are therefore advantageous as they enable steady delivery of electrical charges by a battery. Other advantages and features of the present invention will become apparent after review of the hereinafter set forth Brief Description of the Drawings, Detailed Description of the Invention, and the Claims.

DESCRIPTION OF THE DRAWINGS

Features and advantages of embodiments of the invention will become apparent as the following detailed description proceeds, and upon reference to the drawings, where like numerals depict like elements, and in which.

DETAIL DESCRIPTION OF THE INVENTION

In this description, the term "application" as used herein is intended to encompass executable and non-executable software files, raw data, aggregated data, patches, and other code segments. The term "exemplary" is meant only as an example, and does not indicate any preference for the embodiment or elements described. Further, like numerals refer to like elements throughout the several views, and the articles "a" and "the" includes plural references, unless otherwise specified in the description. The terms lithium-based battery, lithium-ion battery, lithium-iron-phosphate battery, and lithium battery are used interchangeably and "battery" and "battery pack" are used interchangeably. The lithium battery in this specification refers to any type of lithium battery. The standby mode and the sleep mode are used interchangeably.

In an overview, the present invention provides a system and method for enabling a battery system to overcome single point failure in its control system and to deliver electrical charges steadily through redundancy implementation. The system of the present invention is not only applicable for lithium battery system but also to lead-acid battery system and all other battery systems. The system of the present invention provides a battery system with an active-standby topology that prevents outage when a component fails. For certain components in the battery management system, two sets of devices are provided. One device is designated as active device and other device is designated as standby device. For example, when there are two controllers in a system, one controller is running (active), while other controller is in sleep mode (standby). The standby controller will "wake up" periodically to synchronize with the active controller; during this synchronization, the run-time data of the active controller is retrieved by the standby controller before the standby controller goes back to the sleep mode. The active controller monitors and controls the operation of the system and when the active controller is not "healthy," the control of the system is switched to the standby controller.

Figure 1:
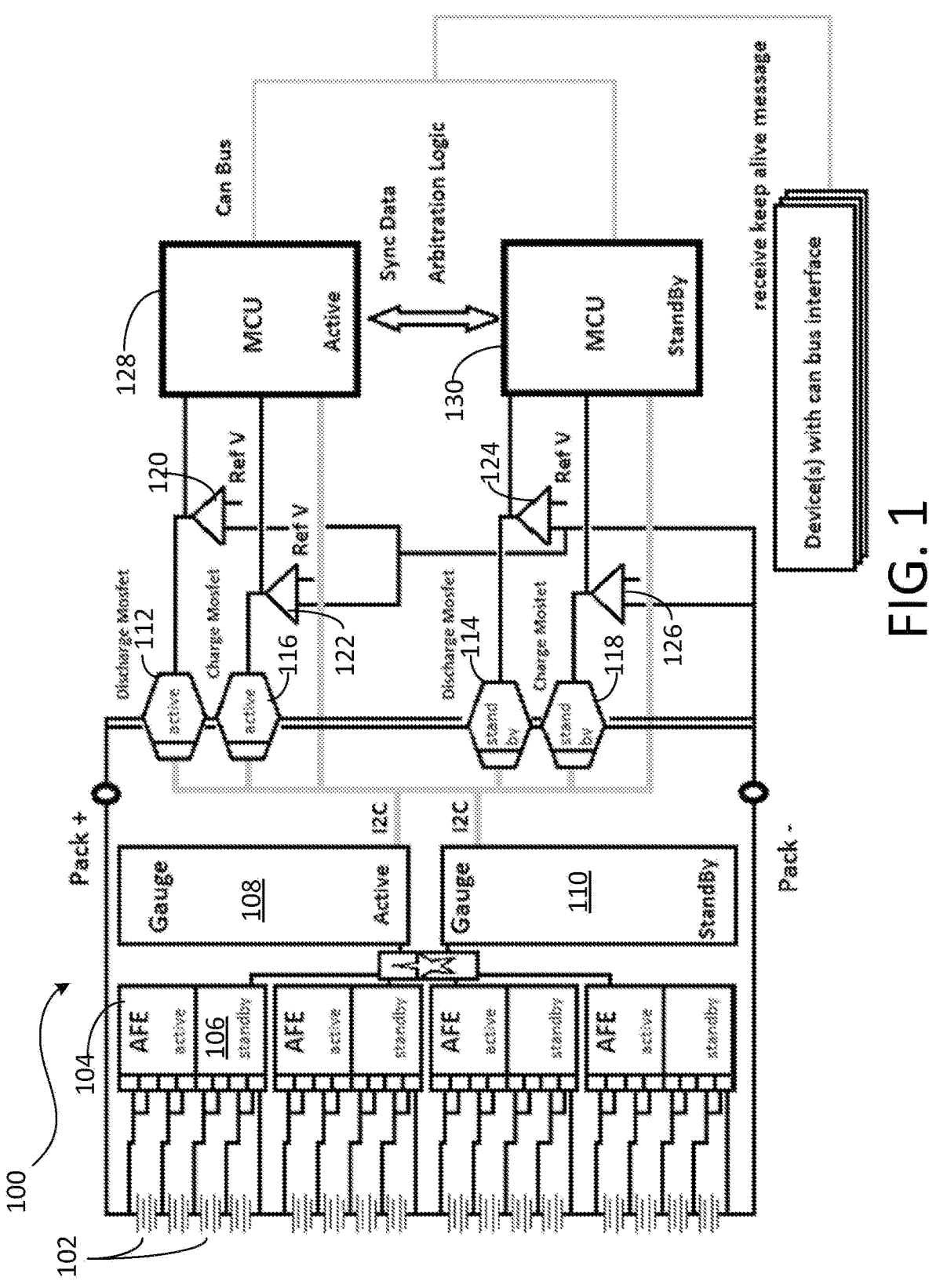
FIG. 1 depicts schematic 100 for a battery management system.

The diagram 100 of FIG. 1 illustrates the objective of the present invention with the active-standby topology. The connecting diagram 100 illustrates a plurality of battery cells 102 connected to a plurality of analog front end (AFE) devices 104, 106. Each of AFE 104, 106 detects and monitors a number of battery cells. The AFE 104, 106 detects output voltage from each battery cell 102 and if the output voltage is out of the expected range, the AFE 104, 106 will record the battery cell 102 as faulty in its internal register. Each of the AFEs 104, 106 is connected to two gauges 108, 110. The gauges 108, 110 are capable of determining state of health for each AFE 104, 106 based on the input from the AFEs. The gauge 108, 110 collects data, such as state of charge (SOC), state of health (SOH), and cycle life. The gauge 108, 110 passes the data to micro control unit (MCU) 128, 130. The MCUs are connected to a controller area network (CAN) bus and each MCU is assigned a unique CAN bus identification number (ID).

The charging and discharging operations by the battery system are controlled by MOSFETs 112, 116, 114, 118. Two MOSFETs are connected to each MCU, one MOSFET, when turned ON, current discharging is enabled, while other MOSFET, when turned ON, battery charging is enabled. Two MOSFETs 112, 116 connected to the active MCU 128 are in active mode and two MOSFETs 114, 118 connected to the standby MCU 130 are in standby mode. The MOSFET in the standby mode will be in OFF state and the MOSFET in the active mode will be in ON state.

The determination of whether to enable operation to charge the battery cells or whether to enable discharge of the current from the battery cells is done by comparing a reference voltage with the output voltage from the battery cells. The comparison is done by comparator 120, 122, 124, 126 and the comparison results control the MOSFETs. The control of charging mode and discharging mode is summarized as follows. The battery cells are in charging mode when MOSFET 116 is ON and the battery cells are in discharging mode when MOSFET 112 is ON. If comparator 122 detects a voltage higher than the reference voltage, then MOSFET 116 is turned OFF. If comparator 120 detects a voltage lower than the reference voltage, then MOSFET 112 is turned OFF. The above control operation prevents one battery management system charges other battery management system and vice-versa. Besides the comparison results, the operation of the MOSFETs is also controlled by the MCU. When the Over Voltage Protection threshold voltage is reached, the charging MOSFET will be turned off from the AFE. When the Under Voltage Protection threshold voltage is reached, the discharging MOSFET 112 is turned off.

The AFE provides a 3-stage protection to the system and each stage is defined by the level of the current output. When the AFE detects a fault, the AFE will react depending on the status of the battery system. In the first stage, under 100 A, the AFE allows the battery system to continue to run. In the second stage, for current between 100 A and 500 A, the battery system will run for 4 minutes. In the third stage, for current over 500 A, the AFE allows the battery system to run for 1 minutes.

AFE 104 provides both Under Voltage Protection and Over Voltage Protection when voltage thresholds are reached. AFE 104 also provides both Under Voltage Release and Over Voltage Release when voltage Release thresholds are reached. The Over Voltage Protection threshold, e.g. 4 V, is reached first and the Charging MOSFT is turned off. The Over Voltage Release, e.g. 3.9 V, is reached to release the Charging MOSFET back to ON state. The Under Voltage Protection threshold, e.g. 3.0 V, is reached first and the Discharging MOSFT is turned off. The Under Voltage Release, e.g. 3.1 V, is reached to release the Charging MOSFET back to ON state. The MCU 128 also provides another layer of protection by monitoring the BMS current. The MCU specifies the current level and the duration. The MCU may set multiple stages and durations to meet different application's requirements. For example, the MCU can enter into sleep mode when the current is under 800 mA for 72 hours.

The MCU 128, 130 executes user defined programs and provides additional protection to the battery system. When the MCU 128, 130 detects a fault in the system or receive a fault indication from the AFE, the MCU can take different measures, such as shutting down the faulty AFE and switching the AFEs. Both MCUs 128, 130 are in communication with external device with the CAN controller (not shown) through CAN bus and each MCU CAN bus controller is assigned a unique identification (ID) number on the same CAN bus.

Figures 2, 3:
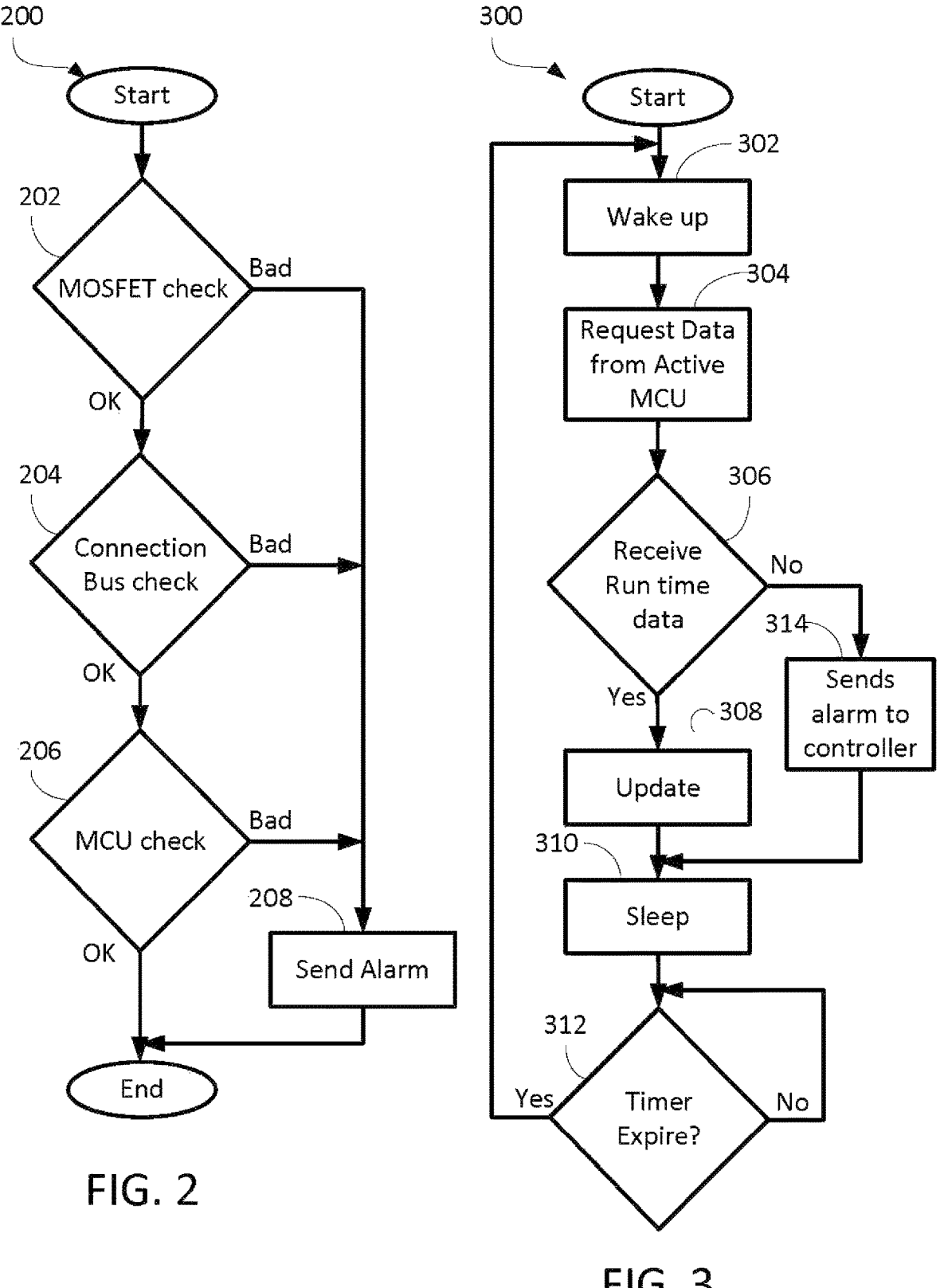
FIG. 2 is a flowchart depicting an initialization process for the battery management system.
FIG. 3 is a flowchart for operation of standby MCU.

FIG. 2 is a flowchart 200 depicting an initialization process for the battery management system. When the battery management system starts, a hardware self-check is done throughout the system. The MOSFETs are checked, step 202, and if any MOSFET is bad, an alarm is sent by the controller and a switch of MOSFETs will be done, step 208. Next it is check connection bus, i.e., whether communication between hardware components are OK, step 204. It is necessary to make sure that the MCUs can communicate through CAN Bus. If either MCU cannot communicate through CAN bus, then it will switch to another CAN bus. Both MCUs need to establish communication with external controller for the system to operate properly. Again, the alarm will be sent if the connection bus is not OK. A record may be made so the system may be analyzed later. Finally, the MCUs are check, step 206. Only after all the components are checked, the battery management system starts normal operation.

FIG. 3 depicts a flowchart 300 for operation of a standby MCU. During the normal operation of the battery management system, one MCU 128 is active while the other MCU 130 is standby. The standby MCU 130 is in sleep mode and wakes periodically, step 302, and requests data from the active MCU 128, step 304. The requested data is the run-time data of the active MCU 128. The run-time data is essential if the active MCU 128 has problem and the standby MCU 130 has to take over. The standby MCU 130 checks whether the run-time data is received, step 306, and if the run-time data is received, the standby MCU 130 updates its internal copy of the run-time data, step 308 and goes back into the sleep mode, step 310. If the run-time data is not received from the active MCU 128, which means that the active MCU 128 may be having problem, an alarm is sent to the controller step 314. The standby MCU 130 will also record the failure to receive the run-time data from the active MCU 128 in a flash memory that is internal to the MCU, so the record can be analyzed later. This cycle is repeated when the timer expires, step 312. The switching between the active MCU 128 and the standby MCU 130 is controlled by the controller. The system will stop if the controller does not receive regular communications from the MCUs.

Figures 4, 5:
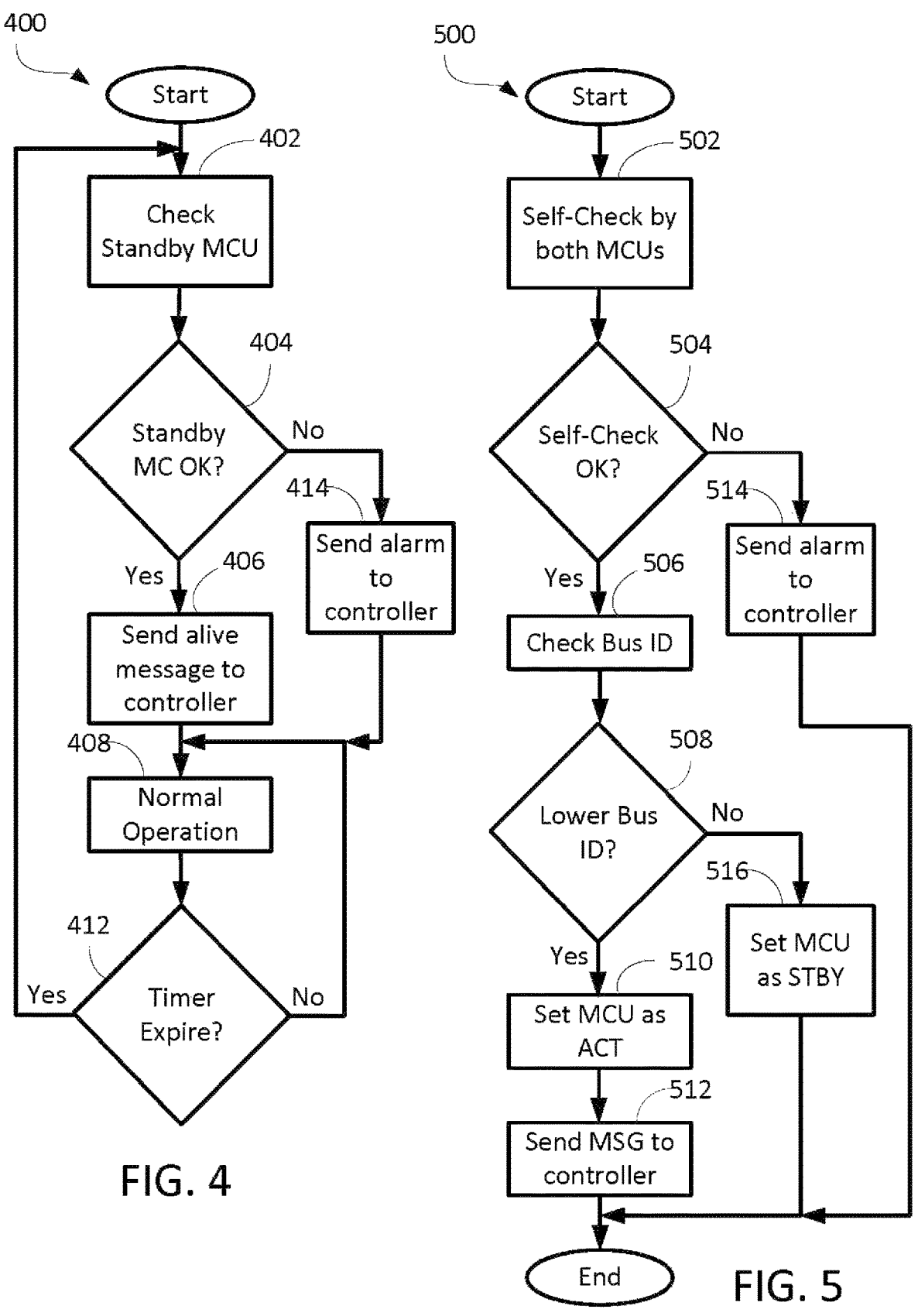
FIG. 4 is a flowchart for operation of active MCU.
FIG. 5 is a flowchart for determining which MCU is the active MCU.

FIG. 4 is flowchart 400 for operation of an active MCU. The active MCU 128 checks the standby MCU 130 periodically, step 402, by sending a message or a probe to request health information from the standby MCU 130. If the standby MCU 130 does not respond, the active MCU 128 sends an alarm to the controller, step 414. If the standby MCU 130 is OK, the active MCU 128 confirms the system is OK and sends a keep alive message to the controller, step 406. The keep alive message is a broadcast message to the CAN bus network. The battery management system continues the normal operation, step 408, and a timer periodically expires causing the active MCU 128 to check the standby MCU 130, step 412.

The procedure of checking whether the standby MCU 130 is healthy may be implemented differently. For example, the standby MCU 130 periodically requests the run-time data from the active MCU 128 as depicted in FIG. 3, and this periodical checkup may be used as an indication of the state of health of the standby MCU 130. If the standby MCU 130 fails to request the run-time date at a predetermined time, the active MCU 128 may interpret this as an indication that the standby MCU 130 may be facing problem. The communication between the active MCU and the standby MCU is first done through the main (active) CAN bus. If the communication fails, the same communication will be tried over the secondary (standby) CAN bus. If the communication between the active MCU and the standby MCU cannot be established over either CAN bus or between the MCUs and the controller, then a major alarm is set and the system stops.

FIG. 5 is a flowchart 500 for determining which MCU is the active MCU during boot procedure. When the system is booted, each MCU performs self-check, step 502. If the self-check for a MCU is not successful, step 504, an alarm is sent to the controller, step 514. When the MCU fails its self-check, the failure is recorded in the flash memory, so it may be analyzed later. After the self-check, the MCU checks its own CAN bus ID, step 506. Each MCU is pre-assigned a CAN bus ID and the MCU knows its hierarchy compared with the other MCU. If the MCU realizes it does NOT have the lower bus ID, step 508, the MCU will understand it is the standby MCU, step 516. If the MCU has the lower bus ID, the MCU sets itself as the active MCU, step 510, and sends a message to the controller, step 512, that informs the controller it is alive. The active MCU 128 continues to send a "keep alive" message to the controller; the standby MCU 130 does not send such message.

When the battery management system is in operation, the high availability of the battery is made possible by several layers of redundancy. The active MCU monitors and controls the battery management system. The active MCU communicates with the active gauge and the active gauge receives data from the active AFE, which monitors the battery cells.

The AFE measures the output voltages of the battery cells and has registers that records the status of each battery cells. The active MCU pulls the data from the active AFE's registers. The gauge determines the state of health (SOH) of the active AFE based on the data from the AFE and this information on SOH is sent to or pull by the active MCU. There are two detection points for each battery cell that the active AFE can access. If the reading from a battery cells is not correct, the registers will reflect the incorrect reading and this is an indication that the AFE is not OK. When the active AFE is not healthy, the standby AFE is made active and the previous active AFE is retired.

If the active gauge has problem, which will impede the active MCU accessing the active AFE, the active gauge provides registers for the active MCU to pull and these registers will indicate whether the active is healthy or not. The active MCU will enable the standby gauge to become active and retire the previously active gauge when the previous active gauge is not healthy.

Finally, when the active MCU faces problem, it will not send "keep alive" message to the controller. The active MCU will notify the standby MCU to switch when the active MCU detects itself as not healthy. The standby MCU will also pull information from the active MCU for health information. If the standby MCU does not receive health information from the active MCU, then switch of MCUs happens. The switching event is logged in the flash memory. The controller will then make the standby MCU active and retire the previously active MCU.

In the context of FIGS. 2-5, the steps illustrated do not require or imply any particular order of actions. The actions may be executed in sequence or in parallel. The method may be implemented by executing a sequence of machine-readable instructions embedded in memory (storage unit) the MCUs or in the controller. The instructions can reside in various types of signal-bearing or data storage media.

What is claimed is:

1. A fault tolerant battery management system with a plurality of battery cells, comprising:

a plurality of application front end (AFE) devices, each AFE device connected to a plurality of battery cells, a first AFE device in the plurality of AFE devices being in active mode and a second AFE device in the plurality of AFE devices being in standby mode;

a plurality of gauges, each gauge connected to both the first AFE device and the second AFE device, a first gauge in the plurality of gauges being in active mode and a second gauge in the plurality of gauges being in standby mode;

a plurality of micro control units (MCUs), each MCU connected to both the first gauge and the second gauge, a first MCU of the plurality of MCUs being in active mode and a second MCU of the plurality of MCUs being in standby mode, both MCUs are connected to a communication bus and each MCU is assigned an identification (ID) number, wherein when the fault tolerant battery management system boots up, each MCU is configured to go through a self-check and a healthy MCU with the lowest ID number is assigned as active MCU while a second healthy MCU is assigned as standby MCU, and the standby MCU periodically requests data from the active MCU.

2. The fault tolerant battery management system of claim 1, further comprising a plurality of controller area network (CAN) buses to which the plurality of MCUs are connected.

3. The fault tolerant battery management system of claim 2, wherein a first CAN bus is designated as active while a second CAN bus is designated as standby.

4. The fault tolerant battery management system of claim 3, wherein communication between the plurality of MCUs is done over the first CAN bus and when the first CAN bus fails, the communication between the plurality of MCUs is switched to the second CAN bus.

5. The fault tolerant battery management system of claim 1, each MCU further comprising a flash memory for storing state of health information of the MCU.

6. The fault tolerant battery management system of claim 5, wherein when a MCU fails self-check, failure of the self-check is recorded in the flash memory.

7. The fault tolerant battery management system of claim 1, wherein when neither of the plurality of MCUs can communicate with an external controller, the fault tolerant battery management system stops normal operation.

8. The fault tolerant battery management system of claim 1, wherein the data periodically requested by the standby MCU is run-time data from the active MCU, and if the standby MCU fails to receive the run-time data from the active MCU, an alarm is sent to an external controller.

9. The fault tolerant battery management system of claim 1, wherein the active MCU periodically requests health data from the standby MCU.

10. The fault tolerant battery management system of claim 1, wherein the active MCU periodically broadcasts a message onto a CAN bus to indicate the active MCU is healthy.

11. A fault tolerant battery management system with a plurality of battery cells, comprising:

a plurality of application front end (AFE) devices, each AFE device connected to a plurality of battery cells, a first AFE device in the plurality of AFE devices being in active mode and a second AFE device in the plurality of AFE devices being in standby mode;

a plurality of gauges, each gauge connected to both the first AFE device and the second AFE device, a first gauge in the plurality of gauges being in active mode and a second gauge in the plurality of gauges being in standby mode;

a plurality of micro control units (MCUs), each MCU connected to both the first gauge and the second gauge, a first MCU of the plurality of MCUs being in active mode and a second MCU of the plurality of MCUs being in standby mode, both MCUs are connected to a communication bus and each MCU is assigned an identification (ID) number; and a plurality of controller area network (CAN) buses to which the plurality of MCUs are connected, wherein each MCU is pre-assigned a CAN bus identification (ID) and each MCU knows its hierarchy compared with other MCU, and if an MCU realizes it does not have a lower CAN bus ID, this MCU sets itself as a standby MCU.

12. The fault tolerant battery management system of claim 11, wherein an MCU with a higher CAN bus ID sets itself as an active MCU and sends a message to an external controller.

13. The fault tolerant battery management system of claim 12, wherein the active MCU continues to send an "alive" message to the external controller and the standby MCU does not send this "alive" message.

* * * * *